(12) United States Patent
Wu et al.

(10) Patent No.: US 10,325,961 B2
(45) Date of Patent: Jun. 18, 2019

(54) ELECTROLUMINESCENT DISPLAY, MANUFACTURE METHOD THEREOF, AND DISPLAY DEVICE

(71) Applicant: BOE TECHNOLOGY GROUP CO., LTD., Beijing (CN)

(72) Inventors: Changyen Wu, Beijing (CN); Guang Yan, Beijing (CN); Yue Hu, Beijing (CN); Yingying Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/562,875

(22) PCT Filed: Apr. 11, 2017

(86) PCT No.: PCT/CN2017/080076
§ 371 (c)(1),
(2) Date: Sep. 28, 2017

(87) PCT Pub. No.: WO2017/198008
PCT Pub. Date: Nov. 23, 2017

(65) Prior Publication Data
US 2018/0190728 A1    Jul. 5, 2018

(30) Foreign Application Priority Data
May 19, 2016  (CN) .......................... 2016 1 0339010

(51) Int. Cl.
*H01L 51/56*   (2006.01)
*H01L 27/32*   (2006.01)
(Continued)

(52) U.S. Cl.
CPC ........ *H01L 27/3213* (2013.01); *H01L 27/322* (2013.01); *H01L 27/3209* (2013.01);
(Continued)

(58) Field of Classification Search
CPC .  H01L 27/32; H01L 27/3209; H01L 27/3213; H01L 27/322; H01L 51/504;
(Continued)

(56) References Cited

U.S. PATENT DOCUMENTS

2004/0262615 A1   12/2004   Cok
2006/0187155 A1    8/2006   Chang et al.
(Continued)

FOREIGN PATENT DOCUMENTS

| CN | 1809936 A | 7/2006 |
| CN | 1815750 A | 8/2006 |

(Continued)

OTHER PUBLICATIONS

Office Action received for Chinese Patent Application No. 201610339010.7, dated Apr. 25, 2018, 14 pages (6 pages of English Translation and 8 pages of Office Action).
(Continued)

*Primary Examiner* — Long K Tran
(74) *Attorney, Agent, or Firm* — Womble Bond Dickinson (US) LLP

(57) ABSTRACT

This disclosure relates to an electroluminescent display, a manufacture method thereof, and a display device. The electroluminescent display device comprises: a substrate, and a plurality of pixel units arranged in an array on the substrate. Each pixel unit comprises a plurality of sub-pixel units. Each pixel unit comprises at least two light-emitting layers connected in series. Furthermore, in each pixel unit, at least one light-emitting layer comprises at least two light-emitting units arranged in parallel and emitting light of different colors. Besides, in each pixel unit, at least one light-emitting unit is configured to be shared by two adjacent sub-pixel units of a corresponding pixel unit.

20 Claims, 8 Drawing Sheets

(51) Int. Cl.
*H01L 51/50* (2006.01)
*H01L 51/52* (2006.01)

(52) U.S. Cl.
CPC ........ *H01L 51/504* (2013.01); *H01L 51/5209* (2013.01); *H01L 51/5225* (2013.01); *H01L 51/56* (2013.01); *H01L 51/5278* (2013.01)

(58) Field of Classification Search
CPC .. H01L 51/5209; H01L 51/5225; H01L 51/56
USPC .......................................................... 257/40
See application file for complete search history.

(56) References Cited

U.S. PATENT DOCUMENTS

| | | | |
|---|---|---|---|
| 2011/0095279 | A1 | 4/2011 | Mizuno et al. |
| 2012/0241726 | A1 | 9/2012 | Kijima |
| 2013/0320308 | A1 | 12/2013 | Lee et al. |
| 2014/0048781 | A1 | 2/2014 | Chang |
| 2015/0014667 | A1* | 1/2015 | Li .................... H01L 51/5096 257/40 |
| 2015/0108456 | A1 | 4/2015 | Shin et al. |
| 2016/0093820 | A1 | 3/2016 | Shin et al. |
| 2016/0351116 | A1* | 12/2016 | Sun .................... H01L 27/3218 |
| 2017/0162634 | A1 | 6/2017 | Yan et al. |
| 2017/0256731 | A1 | 9/2017 | Mu |

FOREIGN PATENT DOCUMENTS

| | | | | |
|---|---|---|---|---|
| CN | 1921717 | A | | 2/2007 |
| CN | 102084720 | A | | 6/2011 |
| CN | 102593109 | A | | 7/2012 |
| CN | 102694002 | A | | 9/2012 |
| CN | 102791051 | A | | 11/2012 |
| CN | 103456761 | A | | 12/2013 |
| CN | 103594487 | A | | 2/2014 |
| CN | 104466007 | A | * | 3/2015 ........... G09G 3/3225 |
| CN | 104752620 | A | | 7/2015 |
| CN | 104766875 | A | | 7/2015 |
| CN | 104851988 | A | | 8/2015 |
| CN | 105097876 | A | | 11/2015 |
| CN | 105226076 | A | | 1/2016 |
| CN | 105895663 | A | | 8/2016 |

OTHER PUBLICATIONS

International Search Report and Written Opinion in PCT/CN2017/080076 dated Jul. 21, 2017, with English translation.

* cited by examiner

ELECTROLUMINESCENT DISPLAY, MANUFACTURE METHOD THEREOF, AND DISPLAY DEVICE

The present application is the U.S. national phase entry of PCT/CN2017/080076, with an international filling date of Apr. 11, 2017, which claims the benefit of priority from the Chinese patent application No. 201610339010.7 filed on May 19, 2016, the disclosures of which are incorporated herein by reference.

FIELD

This disclosure relates to the field of display technologies, and in particular to an electroluminescent display, a manufacture method thereof, and a display device.

BACKGROUND ART

With the development of technologies, organic electroluminescent displays (OLEDs) have gradually become the mainstream in the display field by virtue of excellent performances, such as low power consumption, high color saturation, wide view angle, thin thickness, and flexibility. At present, the full color display of OLEDs is generally implemented by using red (R), green (G) and blue (B) sub-pixels that emit light independently, or by combining a white light OLED with a color filter, and so on. When RGB sub-pixels in the OLEDs are arranged in juxtaposition, light-emitting layers are mainly prepared by a fine metal mask (FMM) technology in nowadays. However, the FMM technology is faced with many difficulties, such as manufacture, washing and deposition of the mask, and many problems, such as alignment and expansion of the FMM during the process. As a result, the color mixing of a display panel is severe, the product yield is low, and the manufacture cost is expensive. Besides, the accuracy control of the FMM is very difficult, which makes it harder to achieve OLEDs with a high resolution. When OLEDs are implemented by combining a white light OLED with a color filter, the white light is absorbed by the color filter. This results in quite little effective light output, and thus a very high power consumption of the product as a whole.

According to the different numbers of light-emitting units, OLEDs can be divided into one-unit OLEDs and stacked OLEDs. Specifically, as shown in FIG. 1, when a stacked OLED device is used, a plurality of light-emitting units 03 connected in series are provided between a cathode 01 and an anode 02 (three light-emitting units connected in series are shown in FIG. 1). With the same brightness, as compared with a conventional one-unit OLED device, the stacked OLED device has a longer service life but less effective light output, which leads to a high power consumption. Taking FIG. 1 as an example, for R pixels: about ⅙ of the light can be utilized; for G pixels: about ⅙ of the light can be utilized; for B pixels: about ⅔ of the light can be utilized; and for W pixels: about 100% of the light can be utilized. Thereby, as can be seen, the R and G pixels have higher power consumption and less light output than the rest of pixels.

Therefore, how to use a new structure design to reduce the product power consumption and improve the resolution is an urgent technical problem for those skilled in the art.

SUMMARY

In light of the above discussions, embodiments of this disclosure provide an electroluminescent display device, a manufacture method thereof, and a display device, so as to at least reduce the power consumption and improve the resolution of the display device.

In one aspect of this disclosure, embodiments provide an electroluminescent display device. The electroluminescent display device comprises: a substrate, and a plurality of pixel units arranged in an array on the basal substrate. Each pixel unit comprises a plurality of sub-pixel units. Each pixel unit comprises at least two light-emitting layers connected in series. In each pixel unit, at least one light-emitting layer comprises at least two light-emitting units arranged in parallel and emitting light of different colors. In each pixel unit, at least one light-emitting unit is configured to be shared by two adjacent sub-pixel units of a corresponding pixel unit.

In a possible implementation, according to the electroluminescent display device provided by embodiments of this disclosure, at least one light-emitting layer comprises only one light-emitting unit in each pixel unit. Besides, the light-emitting unit is configured to be shared by each sub-pixel unit of a corresponding pixel unit.

In a possible implementation, according to the electroluminescent display device provided by embodiments of this disclosure, at least two light-emitting layers connected in series are arranged to stack on top of each other in each pixel unit. Furthermore, each pixel unit further comprises: a charge generation layer between two adjacent light-emitting layers; a first electrode between the substrate and a light-emitting layer closest to the substrate; and a second electrode located above a light-emitting layer farthest from the substrate. Further, the first electrode comprises a plurality of first sub-electrodes, each first sub-electrode corresponding to each sub-pixel unit respectively.

In a possible implementation, according to the electroluminescent display device provided by embodiments of this disclosure, each pixel unit further comprises: a filter arranged on a light exit side of the electroluminescent display device. Furthermore, the filter comprises a plurality of sub-filters corresponding to each sub-pixel unit respectively.

In a possible implementation, according to the electroluminescent display device provided by embodiments of this disclosure, each pixel unit comprises a first light-emitting layer and a second light-emitting layer. The sub-pixel units in each pixel unit are respectively a first sub-pixel unit, a second sub-pixel unit, a third sub-pixel unit, and a fourth sub-pixel unit. Also, in each pixel unit, the first light-emitting layer comprises a first light-emitting unit and a second light-emitting unit, and the second light-emitting layer comprises a third light-emitting unit. Specifically, the first light-emitting unit is configured to be shared by the first sub-pixel unit and the second sub-pixel unit of a corresponding pixel unit. The second light-emitting unit is configured to be shared by the third sub-pixel unit and the fourth sub-pixel unit of a corresponding pixel unit. Besides, the third light-emitting unit is configured to be shared by each sub-pixel unit of a corresponding pixel unit.

In a possible implementation, in the electroluminescent display device provided by embodiments of this disclosure, the first light-emitting unit, the second light-emitting unit and the third light-emitting unit are configured to emit light of yellow, blue and yellow respectively.

In a possible implementation, in the electroluminescent display device provided by embodiments of this disclosure, the first light-emitting unit and the second light-emitting unit are both located below the third light-emitting unit. Alternatively, in a further embodiment, the first light-emitting unit and the second light-emitting unit are both located above the third light-emitting unit.

In a possible implementation, according to the electroluminescent display device provided by embodiments of this disclosure, each pixel unit comprises a first light-emitting layer, a second light-emitting layer and a third light-emitting layer. Moreover, sub-pixel units in each pixel unit are respectively a first sub-pixel unit, a second sub-pixel unit, a third sub-pixel unit, and a fourth sub-pixel unit. Furthermore, in each pixel unit, the first light-emitting layer comprises a first light-emitting unit and a third light-emitting unit; the second light-emitting layer comprises a second light-emitting unit and a fourth light-emitting unit; and the third light-emitting layer comprises a fifth light-emitting unit. Specifically, the first light-emitting unit and the second light-emitting unit are configured respectively to be shared by the first sub-pixel unit and the second sub-pixel unit of a corresponding pixel unit. The third light-emitting unit and the fourth light-emitting unit are configured respectively to be shared by the third sub-pixel unit and the fourth sub-pixel unit of a corresponding pixel unit. In addition, the fifth light-emitting unit is configured to be shared by each sub-pixel unit of a corresponding pixel unit.

In a possible implementation, according to the electroluminescent display device provided by embodiments of this disclosure, the first light-emitting unit, the second light-emitting unit, the third light-emitting unit, the fourth light-emitting unit and the fifth light-emitting unit are configured to emit light of yellow, yellow, blue, blue and yellow respectively.

In a possible implementation, according to the electroluminescent display device provided by embodiments of this disclosure, the first light-emitting unit and the third light-emitting unit are both located above the fifth light-emitting unit. Alternatively, in a further embodiment, the second light-emitting unit and the fourth light-emitting unit are both located below the fifth light-emitting unit.

According to another aspect of this disclosure, embodiments further provide a method for manufacturing the above electroluminescent display device. Specifically, such an electroluminescent display device comprises: a substrate and a plurality of pixel units arranged in an array on the substrate. Each pixel unit comprises a plurality of sub-pixel units. Furthermore, the manufacture method comprises: forming at least two light-emitting layers connected in series within each pixel unit. In this case, at least one light-emitting layer comprises at least two light-emitting units arranged in parallel and emitting light of different colors. Besides, at least one light-emitting unit is configured to be shared by two adjacent sub-pixel units of a corresponding pixel unit.

In a possible implementation, according to the method for manufacturing the above electroluminescent display device provided by embodiments of this disclosure, at least one light-emitting layer comprises only one light-emitting unit in each pixel unit. Besides, such a light-emitting unit is configured to be shared by each sub-pixel unit of a corresponding pixel unit.

In a possible implementation, the method for manufacturing the above electroluminescent display device provided by embodiments of this disclosure further comprises: forming a charge generation layer between two adjacent light-emitting layers arranged in stack; forming a first electrode between the substrate and a light-emitting layer closest to the substrate; and forming a second electrode above a light-emitting layer farthest from the substrate. Further, the first electrode comprises a plurality of first sub-electrodes corresponding to each sub-pixel unit respectively.

According to yet another aspect of this disclosure, embodiments further provide a display device. Such a display device comprises the electroluminescent display device provided in any of the above embodiments.

Embodiments of this disclosure provide an electroluminescent display, a manufacture method thereof, and a display device. Such an electroluminescent display device comprises: a substrate, and a plurality of pixel units arranged in an array on the substrate. Each pixel unit comprises a plurality of sub-pixel units. Each pixel unit comprises at least two light-emitting layers connected in series. Also, in each pixel unit, at least one light-emitting layer comprises at least two light-emitting units arranged in parallel and emitting light of different colors. Besides, in each pixel unit, at least one light-emitting unit is configured to be shared by two adjacent sub-pixel units of a corresponding pixel unit. According to the electroluminescent display device provided by embodiments of this disclosure, it is unnecessary to have all sub-pixel units emit white light. In contrast, part of the sub-pixel units can emit light of other colors. In this way, the light extraction efficiency can be effectively improved, and the overall power consumption of the product can be reduced. Meanwhile, with the same FMM accuracy, the resolution of the display device will be improved considerably.

DETAILED DESCRIPTION OF EMBODIMENTS

Figure 1:
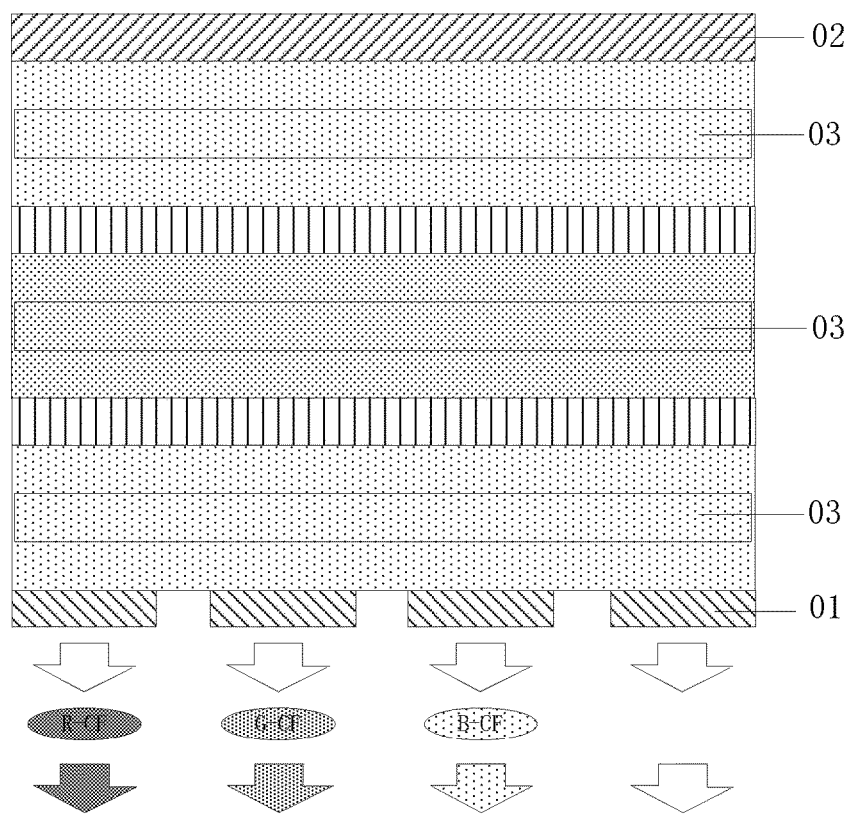
FIG. 1 is a schematic structure view of an existing electroluminescent display device.

Specific embodiments of the electroluminescent display, the manufacture method thereof, and the display device provided in embodiments of this disclosure will be explained below in detail with reference to the drawings.

It should be pointed out that in the drawings, thicknesses and shapes of each film or layer do not reflect the real ratio of each component within the electroluminescent display device. Instead, they are only provided for illustrating the present disclosure.

Figure 2:
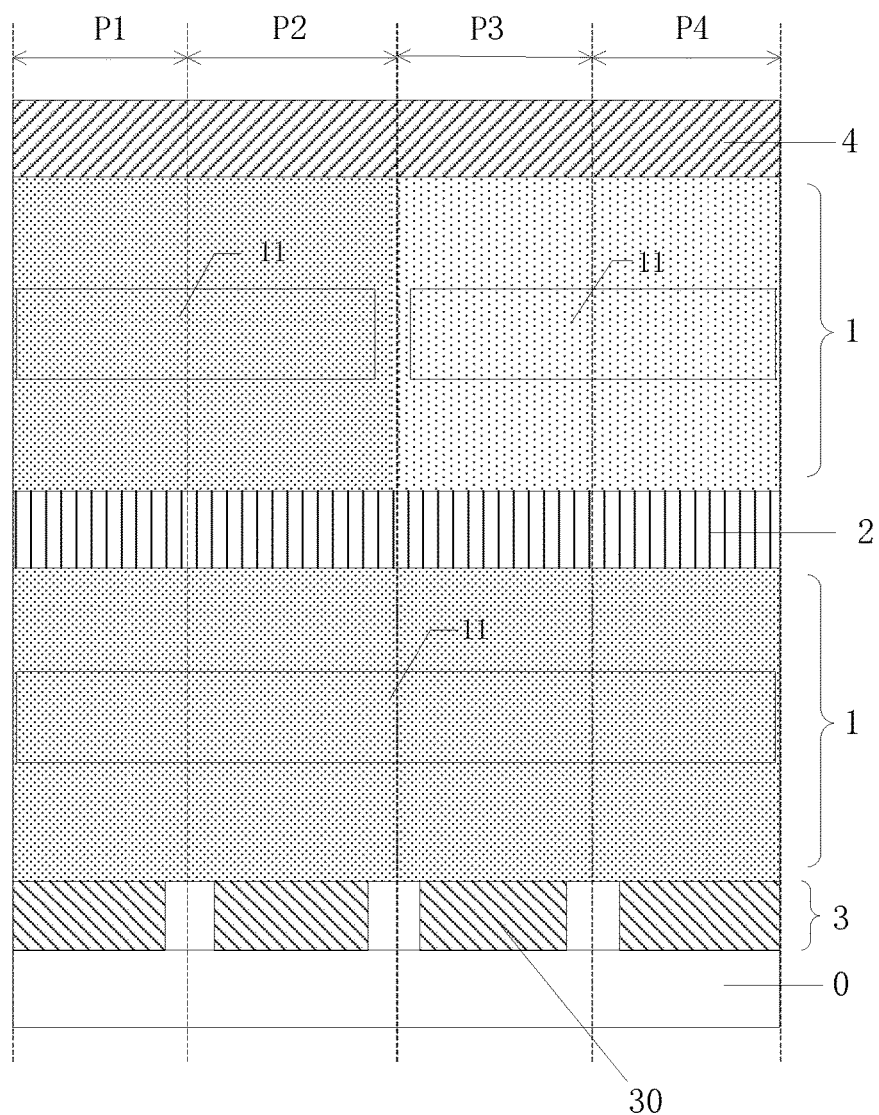
FIG. 2 is a schematic structure view of an electroluminescent display device according to an embodiment of this disclosure.
Figure 3:
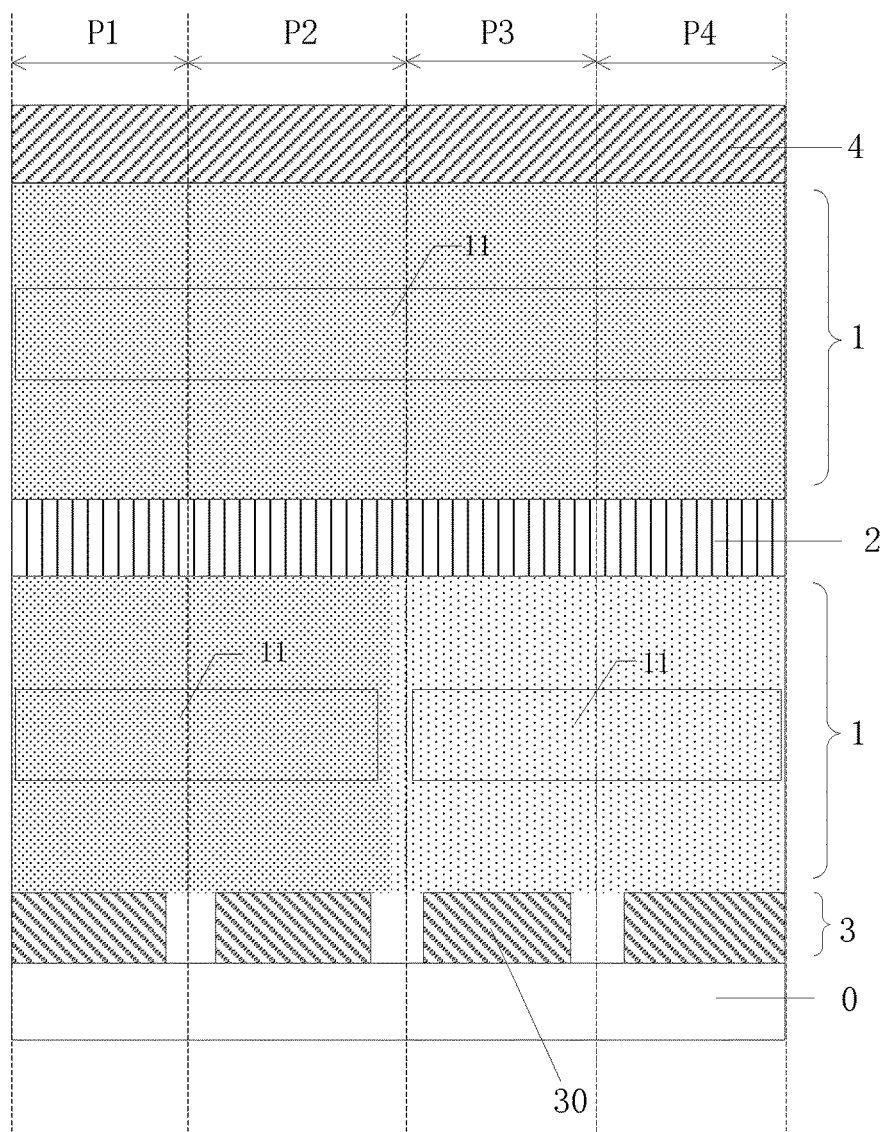
FIG. 3 is a schematic structure view of an electroluminescent display device according to another embodiment of this disclosure.
Figure 4:
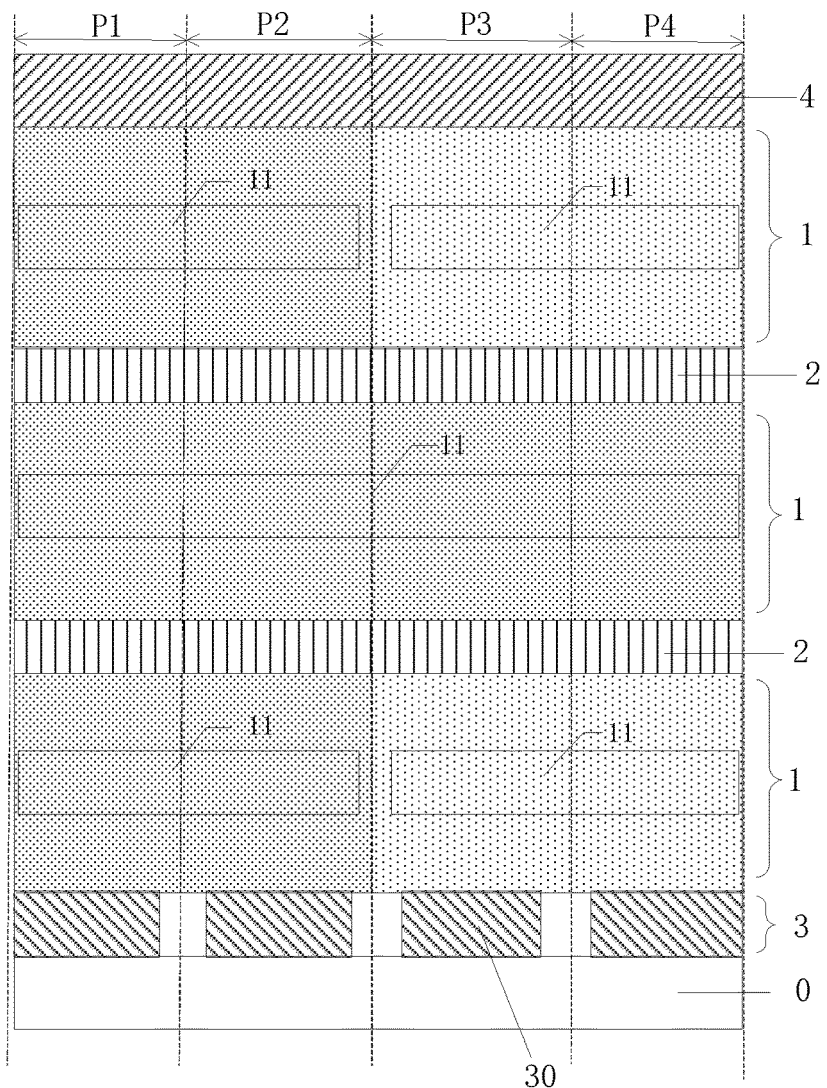
FIG. 4 is a schematic structure view of an electroluminescent display device according to yet another embodiment of this disclosure.

According to one aspect of this disclosure, embodiments provide an electroluminescent display device. As shown in FIGS. 2-4, the electroluminescent display device can specifically comprise: a substrate, and a plurality of pixel units arranged in an array on the substrate. Each pixel unit comprises a plurality of sub-pixel units. Each pixel unit comprises at least two light-emitting layers 1 connected in series. Specifically, in each pixel unit, at least one light-emitting layer 1 comprises at least two light-emitting units 11 arranged in parallel and emitting light of different colors. Besides, at least one light-emitting unit 11 is configured to be shared by two adjacent sub-pixel units of a corresponding pixel unit. In other words, a projection of at least one light-emitting unit 11 on the substrate covers projections of two adjacent sub-pixel units on the substrate.

It should be noted that the wording of "cover" in the above expression of "a projection of at least one light-emitting unit on the substrate covers projections of two adjacent sub-pixel units on the substrate" can be understood as having a corresponding relationship in position. That is to say, at least one light-emitting unit corresponds to two adjacent sub-pixel units in terms of position. The wording of "cover" described below can be all understood as having a corresponding relationship in position. The "sub-pixel unit" here is a minimal display unit in the electroluminescent display device. Each light-emitting unit may be slightly smaller than the minimal display unit because of a pixel defining layer. Therefore, the wording of "cover" does not necessarily mean complete covering. But instead, it can also be construed as partial covering, as long as the light-emitting unit corresponds to respective sub-pixel units in terms of position. Based on a same principle, the expression of "at least one light-emitting unit 11 is configured to be shared by two adjacent sub-pixel units of a corresponding pixel unit" in this disclosure can be construed in a similar way.

According to the electroluminescent display device provided by embodiments of this disclosure, in a same pixel unit, at least one light-emitting layer comprises at least two light-emitting units arranged in parallel and emitting light of different colors. Further, a projection of at least one light-emitting layer on the substrate covers projections of two adjacent sub-pixel units on the substrate. In this way, it is unnecessary to have all sub-pixel units emit white light. But instead, part of the sub-pixel units can emit light of other colors. Thereby, the light extraction efficiency can be effectively improved, and the power consumption of the product as a whole can be reduced. Besides, with the same FMM accuracy, the resolution of the display device will be improved considerably.

Specifically, taking FIG. 2 as an example, each pixel unit is composed of four sub-pixel units, namely, a first sub-pixel unit P1, a second sub-pixel unit P2, a third sub-pixel unit P3, and a fourth sub-pixel unit P4.

Moreover, in a stacked structure, each pixel unit comprises two light-emitting layers 1 connected in series. Furthermore, the upper light-emitting layer 1 may comprise two light-emitting units 11 arranged in parallel and emitting light of different colors, wherein the emission colors can be selected as yellow and blue respectively. Of course, the two light-emitting units 11 can also have other emission colors. Projections of the two light-emitting units 11 on the substrate 0 cover those of two adjacent sub-pixel units on the substrate. Taking FIG. 3 as an example, each pixel unit is composed of four sub-pixel units, namely, a first sub-pixel unit P1, a second sub-pixel unit P2, a third sub-pixel unit P3, and a fourth sub-pixel unit P4. Moreover, in a stacked structure, each pixel unit comprises two light-emitting layers 1 connected in series. Specifically, the lower light-emitting layer 1 comprises two light-emitting units 11 arranged in parallel and emitting light of different colors, wherein the emission colors can be selected as yellow and blue respectively. Apparently, the two light-emitting units 11 can also have other emission colors. Projections of the two light-emitting units 11 on the substrate 0 both cover those of two adjacent sub-pixel units on the substrate. Taking FIG. 4 as an example, each pixel unit is composed of four sub-pixel units.

Each pixel unit comprises three light-emitting layers 1 connected in series. Specifically, the top light-emitting layer 1 and the bottom light-emitting layer 1 both comprise two light-emitting units 11 arranged in parallel and emitting light of different colors, wherein the emission colors can be selected to be yellow and blue respectively. Of course, they can also have other emission colors. Besides, projections of the two light-emitting units 11 on the substrate 0 both cover those of two adjacent sub-pixel units on the substrate. Three schematic structure views of the above electroluminescent display device are briefly listed here. It should be noted that the electroluminescent display device provided by embodiments of this disclosure may also have other structures, as long as the above conditions are satisfied. The present disclosure will not be limited only to the structure of the electroluminescent display device as shown in the drawings.

According to a specific embodiment, in the electroluminescent display device provided by embodiments of this disclosure, at least one light-emitting layer 1 comprises only one light-emitting unit 11 in a same pixel unit, so as to improve further the light extraction efficiency of the display device, as shown in FIGS. 2-4. Besides, a projection of the light-emitting unit 11 on the substrate covers that of each sub-pixel unit on the substrate.

Specifically, taking FIG. 2 as an example, in a same pixel unit, the light-emitting layer 1 located in a lower layer comprises only one light-emitting unit 11. Besides, a projection of the light-emitting unit 11 on the substrate 0 covers that of each sub-pixel unit on the substrate. The emission color of the light-emitting unit 11 can be selected as yellow, or other colors. Taking FIG. 3 as an example, in a same pixel unit, the light-emitting layer 1 located in an upper layer comprises only one light-emitting unit 11. Besides, a projection of the light-emitting unit 11 on the substrate 0 covers that of each sub-pixel unit on the substrate 0. The emission color of the light-emitting unit can be selected as yellow, or other colors. Taking FIG. 4 as an example, in a same pixel unit, the light-emitting layer 1 located in a lower layer comprises only one light-emitting unit 11. Besides, a projection of the light-emitting unit 11 on the substrate 0 covers that of each sub-pixel unit on the substrate. The emission color of the light-emitting unit can be selected as yellow, or other colors.

According to a specific embodiment, in the electroluminescent display device provided by embodiments of this disclosure, as shown in FIGS. 2-4, each pixel unit can further comprise: a charge generation layer 2 between two adjacent light-emitting layers 1 arranged in stack; a first electrode 3 between the substrate 0 and a light-emitting layer 1 closest to the substrate 0; and a second electrode 4 located above a light-emitting layer 1 farthest from the substrate 0. Furthermore, the first electrode 3 comprises a plurality of first sub-electrodes 30 corresponding to each sub-pixel unit respectively.

It should be noted that the drawings of this disclosure are only provided for illustrative purposes. In order to effectively improve the light emitting efficiency of the display device, unmarked layers can be further provided between the light-emitting unit 11 and the first electrode 3, between the light-emitting unit 11 and the second electrode 4, as well as between the light-emitting unit 11 and the charge generation layer 2. All these unmarked layers are conventional films or layers of a light-emitting unit structure in an electroluminescent display device. As an example, they can be for example a hole injection layer, a hole transport layer, an electron blocking layer, a hole blocking layer, an electron transport layer, or an electron injection layer. These specific films or layers can be implemented in many different ways, which will not be limited here. The light-emitting unit herein can be an organic light-emitting material layer.

Figure 5:
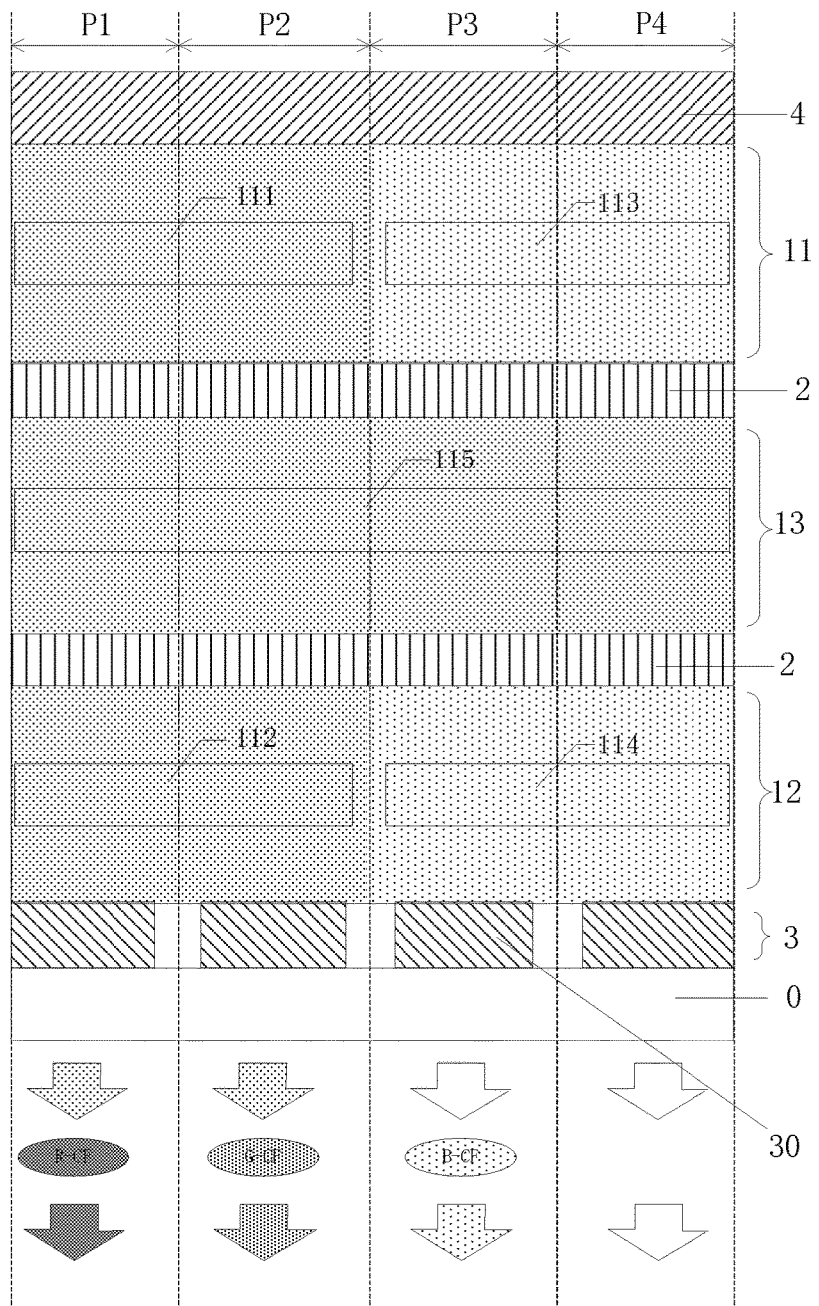
FIG. 5 is a schematic structure view of an electroluminescent display device according to still another embodiment of this disclosure.

According to a specific embodiment, in the electroluminescent display device provided by embodiments of this disclosure, each pixel unit can further comprise a filter arranged on a light exit side of the electroluminescent display device. Specifically, the filter comprises a plurality of sub-filters, which correspond to each sub-pixel unit respectively. Taking FIG. 5 as an example, the electroluminescent display device is shown as a bottom emission type of electroluminescent display device with a light exit side located beneath. Therefore, the filter CF can be arranged below the first electrode 3, but usually not adjoin the first electrode. As shown in FIG. 5, each pixel unit of the electroluminescent display device comprises four sub-pixel unit, a first sub-pixel unit P1, a second sub-pixel unit P2, a third sub-pixel unit P3, and a fourth sub-pixel unit P4. From bottom to top, the electroluminescent device in FIG. 5 comprises a substrate 0, a first electrode 3, a second light-emitting layer 12, a charge generation layer 2, a third light-emitting layer 13, a charge generation layer 2, a first light-emitting layer 11, and a second electrode 4. Further, the first light-emitting layer 11 comprises a first light-emitting unit 111 and a third light-emitting unit 113; the second light-emitting layer 12 comprises a second light-emitting unit 112 and a fourth light-emitting unit 114; and the third light-emitting layer 13 comprises a fifth light-emitting unit 115. When light emitted by the light-emitting unit passes through the filter CF, it can exhibit four colors, namely, red, green, blue and white. In this case, for the R pixels: about ½ of the light can be utilized, which reduces the power consumption by a factor of about ⅓ as compared with the conventional solution; for the G pixels: about ½ of the light can be utilized, which reduces the power consumption by a factor of about ⅓ as compared with the conventional solution; for the B pixels: about ⅔ of the light can be utilized, which makes no difference as compared with the conventional solution; and for the W pixels: about 100% of the light can be utilized, which makes no difference as compared with the conventional solution. Accordingly, as compared with the conventional solution, the power consumption for the R pixels and the G pixels is clearly reduced, and the light extraction efficiency is thus improved.

According to a specific embodiment, in the electroluminescent display device provided by embodiments of this disclosure, as shown in FIGS. 2-3, each pixel unit can be composed of four sub-pixel units. Each pixel unit can specifically comprise: a first light-emitting unit, a second light-emitting unit, and a third light-emitting unit. A projection of the first light-emitting unit on the substrate covers projections of the first sub-pixel unit and the second sub-pixel unit on the substrate. A projection of the second light-emitting unit on the substrate covers projections of the third sub-pixel unit and the fourth sub-pixel unit on the substrate. Besides, a projection of the third light-emitting unit on the substrate covers that of each sub-pixel unit on the substrate. Specifically, the first light-emitting unit and the second light-emitting unit are arranged in parallel and emitting light of different colors.

According to a specific embodiment, in the electroluminescent display device provided by embodiments of this disclosure, specifically, the emission colors of the first light-emitting unit and the second light-emitting unit can be chosen as yellow and blue respectively, while the emission color of the third light-emitting unit can be chosen as yellow. Of course, they can also have other emission colors, which will not be limited here.

According to a specific embodiment, in the electroluminescent display device provided by embodiments of this disclosure, as shown in FIG. 2, the first light-emitting unit and the second light-emitting unit are both located above the third light-emitting unit. Alternatively, in a further embodiment, as shown in FIG. 3, the first light-emitting unit and the second light-emitting unit are both located below the third light-emitting unit. It should be noted that specific arrangements of the light-emitting units in the two light-emitting layers can be selected upon actual situations, which will not be limited here.

According to a specific embodiment, in the electroluminescent display device provided by embodiments of this disclosure, as shown in FIG. 4, each pixel unit can be composed of four sub-pixel units. Each pixel unit can specifically comprise: a first light-emitting unit, a second light-emitting unit, a third light-emitting unit, a fourth light-emitting unit, and a fifth light-emitting unit. Projections of the first light-emitting unit and the second light-emitting unit on the substrate both cover those of the first sub-pixel unit and the second sub-pixel unit on the substrate. Projections of the third light-emitting unit and the fourth light-emitting unit on the substrate both cover those of the third sub-pixel unit and the fourth sub-pixel unit on the substrate. Besides, a projection of the fifth light-emitting unit on the substrate covers that of each sub-pixel unit on the substrate. Specifically, the first light-emitting unit and the third light-emitting unit are arranged in parallel and emit light of different colors, and the second light-emitting unit and the fourth light-emitting unit are arranged in parallel and emit light of different colors.

According to a specific embodiment, in the electroluminescent display device provided by embodiments of this disclosure, specifically, the emission colors of the first light-emitting unit and the second light-emitting unit can be both selected as yellow, the emission colors of the third light-emitting unit and the fourth light-emitting unit can be both selected as blue, and the emission color of the fifth light-emitting unit can be set as yellow. Of course, they can also have other emission colors, which will not be limited here.

According to a specific embodiment, in the electroluminescent display device provided by embodiments of this disclosure, as shown in FIG. 2, the first light-emitting unit and the third light-emitting unit are both located above the fifth light-emitting unit, and the second light-emitting unit and the fourth light-emitting unit are both located below the fifth light-emitting unit. It should be noted that, specific arrangements of the light-emitting units in the two light-emitting layers can be selected upon actual situations, which will not be limited here.

Based on a same concept, embodiments of this disclosure further provide a method for manufacturing the above electroluminescent display device. Since the principle of the method for solving problems is similar to that of the aforementioned electroluminescent display device, for implementations of the method, implementations of the electroluminescent display device as described above can be referred to, which will not be repeated here for simplicity.

According to a specific embodiment, in the method for manufacturing the electroluminescent display device provided by embodiments of this disclosure, the electroluminescent display device comprises: a substrate, and a plurality of pixel units arranged in an array on the substrate. Each pixel unit comprises a plurality of sub-pixel units. Specifically, the method comprises steps as follows: forming at least two light-emitting layers connected in series within each pixel unit, wherein at least one light-emitting layer comprises at least two light-emitting units arranged in parallel and emitting light of different colors. Moreover, a projection of at least one light-emitting unit on the substrate covers projections of two adjacent sub-pixel units on the substrate.

According to a specific embodiment, in the method for manufacturing the electroluminescent display device provided by embodiments of this disclosure, at least one light-emitting layer comprises only one light-emitting unit within each pixel unit. Besides, a projection of the light-emitting unit on the substrate covers that of each sub-pixel unit on the substrate.

According to a specific embodiment, the method for manufacturing the electroluminescent display device provided by embodiments of this disclosure further specifically comprises steps as follows: forming a charge generation layer between two adjacent light-emitting layers arranged in stack; forming a first electrode between the substrate and a light-emitting layer closest to the substrate; and forming a second electrode above a light-emitting layer farthest from the substrate. Furthermore, the first electrode comprises a plurality of first sub-electrodes corresponding to each sub-pixel unit respectively.

The method for manufacturing the electroluminescent display device provided by embodiments of this disclosure will be explained below in detail with a specific example. Such a method specifically comprises steps as follows.

Step 1, forming a pattern of first electrode within each sub-pixel unit on a substrate.

Figure 6A:
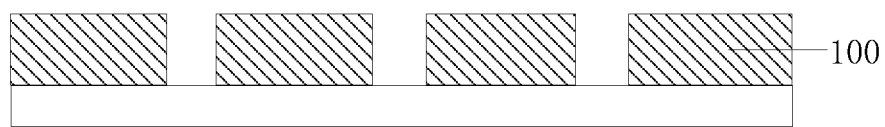
FIGS. 6a to 6e are schematic structure views respectively of an electroluminescent display device obtained after different steps of a method for manufacturing the electroluminescent display device as shown in FIG. 2.

Specifically, as shown in FIG. 6a, a pattern of first electrode 100 is formed by a patterning process on the substrate. In this case, in a same pixel unit, four sub-pixel units correspond to the first electrode 100.

Step 2, forming a pattern of first light-emitting layer within each sub-pixel unit on the substrate on which the pattern of first electrode has been formed. The first light-emitting layer comprises only one light-emitting unit. Besides, a projection of the light-emitting unit on the substrate covers that of each sub-pixel unit on the substrate.

Figure 6B:
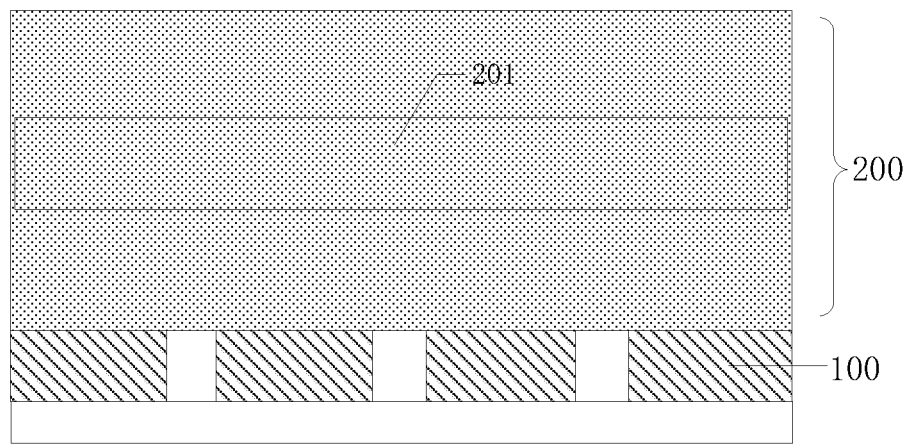

Specifically, as shown in FIG. 6b, a pattern of first light-emitting layer 200 is formed by a patterning process within each pixel unit on the substrate on which the pattern of first electrode 100 has been formed. The first light-emitting layer comprises only one light-emitting unit 201. Besides, a projection of the first light-emitting unit 201 on the substrate covers that of each sub-pixel unit on the substrate. Patterns of a hole injection layer, a hole transport layer and/or an electron blocking layer (not shown) can be formed between the first electrode 100 and the first light-emitting unit 201. Patterns of a hole blocking layer, an electron transport layer and/or an electron injection layer (not shown) can be formed on a surface of the first light-emitting unit 201.

Step 3, forming a pattern of charge generation layer on a first light-emitting unit layer formed within each pixel unit.

Figure 6C:
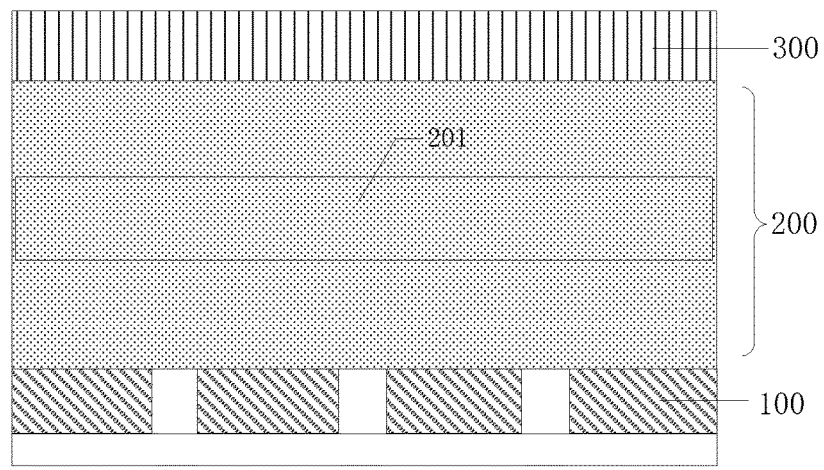

Specifically, as shown in FIG. 6c, a pattern of charge generation layer 300 is formed by a patterning process on a first light-emitting unit layer 200 formed within each pixel unit. Specifically, a projection of the charge generation layer 300 on the substrate covers that of each sub-pixel unit on the substrate.

Step 4, forming a pattern of second light-emitting layer on the charge generation layer formed within each pixel unit. The second light-emitting layer comprises two light-emitting units arranged in parallel and emitting light of different colors. Projections of the two light-emitting units on the substrate both cover those of two adjacent sub-pixel units on the substrate.

Figure 6D:
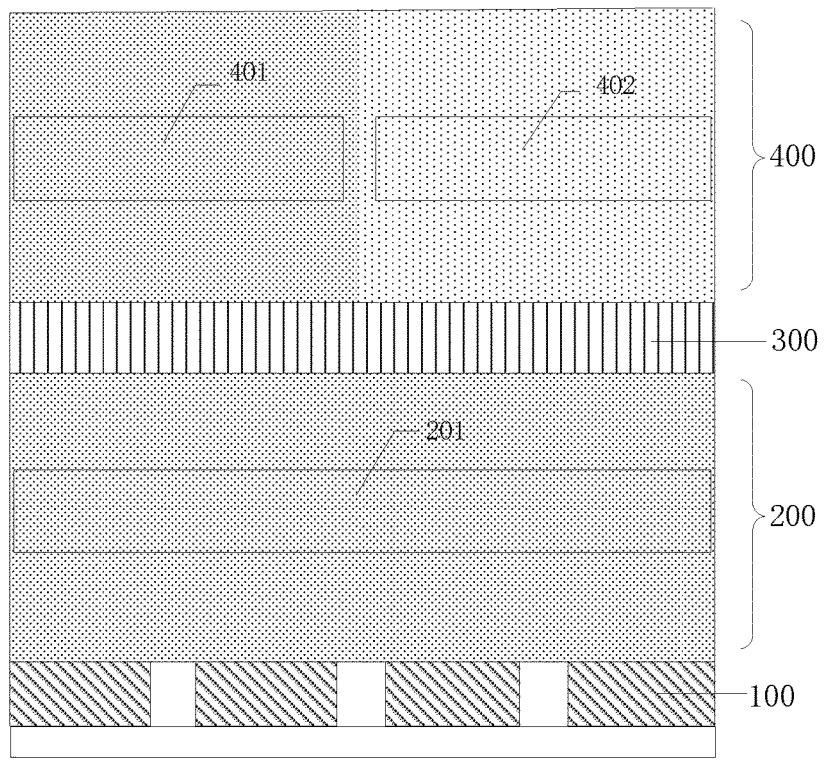

Specifically, as shown in FIG. 6d, a second light-emitting layer 400 is formed by a patterning process on the charge generation layer 300 formed within each pixel unit. The second light-emitting layer 400 comprises two light-emitting units arranged in parallel and emitting light of different colors, i.e., a second light-emitting unit 401 and a third light-emitting unit 402. A projection of the second light-emitting unit 401 on the substrate covers projections of the first sub-pixel unit and the second sub-pixel unit on the substrate. A projection of the third light-emitting unit 402 on the substrate covers projections of the third sub-pixel unit and the fourth sub-pixel unit on the substrate. Patterns of a hole injection layer, a hole transport layer and/or an electron blocking layer can be formed between the charge generation layer 300 and the second light-emitting unit 401 or the third light-emitting unit 402. Patterns of a hole blocking layer, an electron transport layer and/or an electron injection layer can be formed on a surface of the second light-emitting unit 401 or the third light-emitting unit 402.

Step 5, forming a pattern of second electrode on the second light-emitting layer formed within each pixel unit.

Figure 6E:
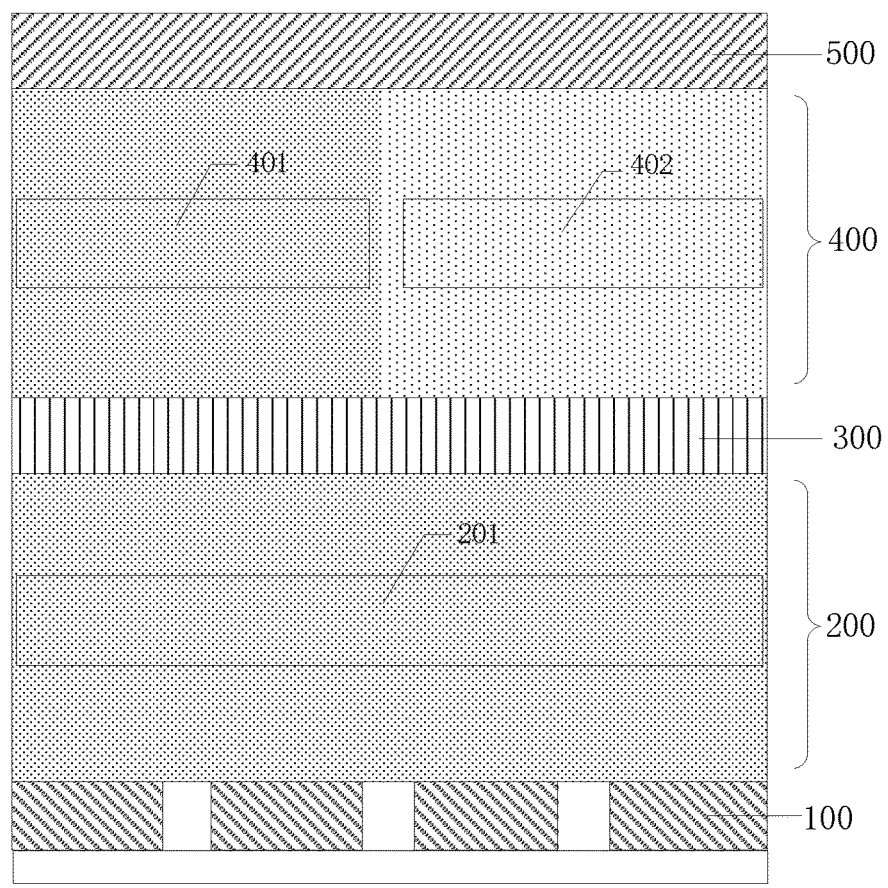

Specifically, as shown in FIG. 6e, a pattern of second electrode 500 is formed on the second light-emitting layer 400 formed within each pixel unit. Specifically, a projection of the second electrode 500 on the substrate covers that of each sub-pixel unit on the substrate.

So far, the electroluminescent display device provided by embodiments of this disclosure has been manufactured through steps 1 to 5 provided in the above specific examples.

Based on a same concept, embodiments of this disclosure further provide a display device, comprising the electroluminescent display device provided in any of the above embodiments. The display device can be any product or component having a display function, such as a cellphone, a tablet computer, a television, a display, a notebook computer, a digital photo frame, a navigator and the like. Other indispensable components of the display device are all comprised, as should be understood by one having ordinary skills in the art. This will not be detailed here for simplicity and should not be construed as limiting this disclosure. For implementations of the display device, embodiments of the above electroluminescent display device can be referred to, which will not be repeated here for simplicity.

Embodiments of this disclosure provide an electroluminescent display, a manufacture method thereof, and a display device. The electroluminescent display device comprises: a substrate, and a plurality of pixel units arranged in an array on the substrate. Each pixel unit comprises a plurality of sub-pixel units. Each pixel unit comprises at least two light-emitting layers connected in series. In a same pixel unit, at least one light-emitting layer comprises at least two light-emitting units arranged in parallel and emitting light of different colors. A projection of at least one light-emitting unit on the substrate covers projections of two adjacent sub-pixel units on the substrate. The electroluminescent display device provided by embodiments of this disclosure does not require all sub-pixel units to emit white light. In contrast, part of the sub-pixel units can emit light of other colors. In this way, the light extraction efficiency can be effectively improved, and the power consumption of the product as a whole can be reduced. Besides, with the same FMM accuracy, the resolution of the display device will be improved considerably.

Obviously, those skilled in the art can make various modifications and variations to this disclosure without departing from the spirits and scope of this disclosure. Thus, if these modifications and variations to this disclosure fall within the scopes of claims in this disclosure and the equivalent techniques thereof, this disclosure is intended to include them too.

The invention claimed is:

1. An electroluminescent display device, comprising:
a substrate, and
a plurality of pixel units arranged in an array on the substrate, wherein
each pixel unit comprises at least two light-emitting layers connected in series,
in each pixel unit, at least one light-emitting layer comprises at least two light-emitting units arranged in parallel and emitting light of different colors, and
in each pixel unit, at least one light-emitting unit is configured to be shared by two adjacent sub-pixel units of a corresponding pixel unit.

2. The electroluminescent display device according to claim 1, wherein in each pixel unit,
the at least one light-emitting layer comprises only one light-emitting unit, and
the light-emitting unit is configured to be shared by each sub-pixel unit of a corresponding pixel unit.

3. The electroluminescent display device according to claim 1, wherein
in each pixel unit, the at least two light-emitting layers connected in series are arranged to stack on top of each other.

4. The electroluminescent display device according to claim 3, wherein each pixel unit further comprises:
a charge generation layer between two adjacent light-emitting layers;
a first electrode between the substrate and a light-emitting layer closest to the substrate; and
a second electrode above a light-emitting layer farthest from the substrate,
wherein the first electrode comprises a plurality of first sub-electrodes, each first sub-electrode corresponding to each sub-pixel unit respectively.

5. The electroluminescent display device according to claim 1, wherein
each pixel unit further comprises: a filter arranged on a light exit side of the electroluminescent display device, wherein the filter comprises a plurality of sub-filters corresponding to each sub-pixel unit respectively.

6. The electroluminescent display device according to claim 1, wherein
each pixel unit comprises a first light-emitting layer and a second light-emitting layer;
sub-pixel units in each pixel unit are respectively a first sub-pixel unit, a second sub-pixel unit, a third sub-pixel unit, and a fourth sub-pixel unit; and
in each pixel unit, the first light-emitting layer comprises a first light-emitting unit and a second light-emitting unit, and the second light-emitting layer comprises a third light-emitting unit, wherein
the first light-emitting unit is configured to be shared by the first sub-pixel unit and the second sub-pixel unit of a corresponding pixel unit,
the second light-emitting unit is configured to be shared by the third sub-pixel unit and the fourth sub-pixel unit of a corresponding pixel unit, and
the third light-emitting unit is configured to be shared by each sub-pixel unit of a corresponding pixel unit.

7. The electroluminescent display device according to claim 6, wherein
the first light-emitting unit, the second light-emitting unit and the third light-emitting unit are configured to emit light of yellow, blue, and yellow respectively.

8. The electroluminescent display device according to claim 6, wherein
the first light-emitting unit and the second light-emitting unit are both located below the third light-emitting unit or above the third light-emitting unit.

9. A display device, comprising the electroluminescent display device according to claim 1.

10. The electroluminescent display device according to claim 6, wherein each pixel unit further comprises:
a charge generation layer between two adjacent light-emitting layers;
a first electrode between the substrate and a light-emitting layer closest to the substrate; and
a second electrode above a light-emitting layer farthest from the substrate,
wherein the first electrode comprises a plurality of first sub-electrodes, each first sub-electrode corresponding to each sub-pixel unit respectively.

11. The electroluminescent display device according to claim 6, wherein
each pixel unit further comprises: a filter arranged on a light exit side of the electroluminescent display device, wherein the filter comprises a plurality of sub-filters corresponding to each sub-pixel unit respectively.

12. The electroluminescent display device according to claim 6, wherein
the first light-emitting layer and the second light-emitting layer in each pixel unit are arranged to stack on top of each other.

13. The electroluminescent display device according to claim 1, wherein
each pixel unit comprises a first light-emitting layer, a second light-emitting layer, and a third light-emitting layer;
sub-pixel units in each pixel unit are respectively a first sub-pixel unit, a second sub-pixel unit, a third sub-pixel unit, and a fourth sub-pixel unit; and
in each pixel unit, the first light-emitting layer comprises a first light-emitting unit and a third light-emitting unit, the second light-emitting layer comprises a second light-emitting unit and a fourth light-emitting unit, and the third light-emitting layer comprises a fifth light-emitting unit, wherein
the first light-emitting unit and the second light-emitting unit are configured respectively to be shared by the first sub-pixel unit and the second sub-pixel unit of a corresponding pixel unit,
the third light-emitting unit and the fourth light-emitting unit are configured respectively to be shared by the third sub-pixel unit and the fourth sub-pixel unit of a corresponding pixel unit, and
the fifth light-emitting unit is configured to be shared by each sub-pixel unit of a corresponding pixel unit.

14. The electroluminescent display device according to claim 13, wherein
the first light-emitting unit, the second light-emitting unit, the third light-emitting unit, the fourth light-emitting unit, and the fifth light-emitting unit are configured to emit light of yellow, yellow, blue, blue and yellow respectively.

15. The electroluminescent display device according to claim 13, wherein
the first light-emitting unit and the third light-emitting unit are both located above the fifth light-emitting unit, and
the second light-emitting unit and the fourth light-emitting unit are both located below the fifth light-emitting unit.

16. The electroluminescent display device according to claim 13, wherein each pixel unit further comprises:
a charge generation layer between two adjacent light-emitting layers;
a first electrode between the substrate and a light-emitting layer closest to the substrate; and
a second electrode above a light-emitting layer farthest from the substrate,
wherein the first electrode comprises a plurality of first sub-electrodes, each first sub-electrode corresponding to each sub-pixel unit respectively.

17. The electroluminescent display device according to claim 13, wherein
each pixel unit further comprises: a filter arranged on a light exit side of the electroluminescent display device, wherein the filter comprises a plurality of sub-filters corresponding to each sub-pixel unit respectively.

18. A method for manufacturing the electroluminescent display device according to claim 1, wherein
the electroluminescent display device comprises: a substrate and a plurality of pixel units arranged in an array on the substrate; and
the method comprising:
forming at least two light-emitting layers connected in series within each pixel unit, wherein
at least one light-emitting layer comprises at least two light-emitting units arranged in parallel and emitting light of different colors; and
at least one light-emitting unit is configured to be shared by two adjacent sub-pixel units of a corresponding pixel unit.

19. The method according to claim 18, wherein in each pixel unit,
at least one light-emitting layer comprises only one light-emitting unit, and
the light-emitting unit is configured to be shared by each sub-pixel unit of a corresponding pixel unit.

20. The method according to claim 18, further comprising:
forming a charge generation layer between two adjacent light-emitting layers arranged in stack;
forming a first electrode between the substrate and a light-emitting layer closest to the substrate; and
forming a second electrode above a light-emitting layer farthest from the substrate, wherein
the first electrode comprises a plurality of first sub-electrodes corresponding to each sub-pixel unit respectively.

* * * * *